United States Patent
Tai

(10) Patent No.: US 8,334,566 B2
(45) Date of Patent: Dec. 18, 2012

(54) SEMICONDUCTOR POWER DEVICE HAVING SHIELDING ELECTRODE FOR IMPROVING BREAKDOWN VOLTAGE

(75) Inventor: Sung-Shan Tai, San Jose, CA (US)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 294 days.

(21) Appl. No.: 12/829,349

(22) Filed: Jul. 1, 2010

(65) Prior Publication Data
US 2011/0233659 A1    Sep. 29, 2011

(30) Foreign Application Priority Data
Mar. 29, 2010    (TW) .............................. 99109357 A

(51) Int. Cl.
*H01L 29/76* (2006.01)

(52) U.S. Cl. ........ 257/330; 257/331; 257/334; 257/341; 257/394; 257/401; 257/E21.19; 257/E29.262

(58) Field of Classification Search ................... 257/330, 257/331, 334, 341, 394, 401, E21.19, E29.262
See application file for complete search history.

(56) References Cited

U.S. PATENT DOCUMENTS

| | | | | |
|---|---|---|---|---|
| 5,404,040 A | * | 4/1995 | Hshieh et al. ................. | 257/341 |
| 5,521,409 A | * | 5/1996 | Hshieh et al. ................. | 257/341 |
| 5,597,765 A | * | 1/1997 | Yilmaz et al. ................. | 438/270 |
| 5,612,232 A | * | 3/1997 | Thero et al. ................... | 438/571 |
| 5,614,751 A | * | 3/1997 | Yilmaz et al. ................. | 257/394 |
| 6,031,265 A | * | 2/2000 | Hshieh ......................... | 257/334 |
| 6,369,090 B1 | * | 4/2002 | Schelberger et al. ......... | 514/384 |
| 7,800,185 B2 | * | 9/2010 | Hshieh ......................... | 257/401 |
| 7,855,415 B2 | * | 12/2010 | Challa et al. .................. | 257/341 |
| 7,977,745 B2 | * | 7/2011 | Hshieh ......................... | 257/341 |

* cited by examiner

*Primary Examiner* — Andy Huynh
(74) *Attorney, Agent, or Firm* — Winston Hsu; Scott Margo

(57) ABSTRACT

The present invention provides a semiconductor power device including a substrate, an epitaxial layer disposed on the substrate and having at least a first trench and a second trench, a gate structure disposed in the first trench, and a termination structure disposed in the second trench. The gate structure includes a gate electrode, a gate dielectric layer disposed on an upper sidewall of the first trench and between the gate electrode and the epitaxial layer, and a shield electrode disposed under the gate electrode. The termination structure includes a termination electrode and a dielectric layer disposed between the termination electrode and a sidewall of the second trench. The termination electrode and the shield electrode are connected to each other. In addition, a body region is disposed in the epitaxial layer, and the second trench is only surrounded by the body region.

8 Claims, 12 Drawing Sheets

SEMICONDUCTOR POWER DEVICE HAVING SHIELDING ELECTRODE FOR IMPROVING BREAKDOWN VOLTAGE

BACKGROUND OF THE INVENTION

1. Field of the Invention

The present invention relates to a semiconductor power device and a manufacturing method thereof, and more particularly, to a semiconductor power device and a manufacturing method thereof to reduce the number of masks in the manufacturing process.

2. Description of the Prior Art

A trench metal-oxide-semiconductor field effect transistor (Trench MOSFET) is a common semiconductor power device. In the trench metal-oxide-semiconductor field effect transistor, a gate electrode is disposed in a trench of a substrate, and a source electrode and a drain electrode are respectively disposed at an upper side and a lower side of the gate electrode. A channel is vertically formed between the source electrode and the drain electrode. Accordingly, some advantages are provided by this structure, such as a high voltage-withstand ability, a low on-resistance, and a larger current. As a result, the trench metal-oxide-semiconductor field effect transistors are widely applied in power management, such as switching power supplies, integrated circuits used in power management, backlight power supplies, and motor controllers.

In the prior art, the number of masks utilized in the manufacturing processes of the trench metal-oxide-semiconductor field effect transistors is generally up to eight or nine. For example, the masks includes a trench mask, a body mask, a source mask, a poly 1 mask, a poly 2 mask, an oxide mask, a contact mask, a metal mask, and so on. In addition, in order to reduce the capacitance between the gate electrode and the drain electrode and to improve the breakdown voltage of the transistor, additional manufacturing processes with other masks are performed to form a shield electrode under the gate electrode. On the other hand, in order to avoid the channeling effect between the trench metal-oxide-semiconductor field effect transistors and other components, some manufacturing processes with other masks are required to define a termination structure for isolating different components.

Each of the manufacturing processes with the masks requires a plurality of steps, such cleaning steps, photoresist coating steps, exposure steps, developing steps, etching steps, photoresist stripping steps, or checking steps. Thus, the complexity and the processing time of the manufacturing process are increased due to the larger number of the masks, and this undesirably results in a higher manufacturing cost and a low yield. Therefore, a new manufacturing process is required to simplify the conventional processes and to reduce the number of the masks.

SUMMARY OF THE INVENTION

It is therefore one of the objectives of the present invention to provide a semiconductor power device and a manufacturing method thereof to solve the problem in the prior art.

According to a preferred embodiment of the present invention, a manufacturing method of a semiconductor power device is provided. The manufacturing method includes the following steps. First, a substrate is provided, and an epitaxial layer is formed on the substrate. Then, at least a first trench and at least a second trench are formed in the epitaxial layer. Subsequently, a first conductive layer is deposited to fill the first trench and the second trench. Following that, the first conductive layer is etched to form a shield electrode in the first trench, to form a termination electrode in the second trench, and to expose an upper sidewall of the first trench and an upper sidewall of the second trench. Then, a gate dielectric layer is formed to cover the upper sidewall of the first trench, the upper sidewall of the second trench, the shield electrode, and the termination electrode. Moreover, a second conductive layer is deposited on the gate dielectric layer to fill up the first trench and partially fill in the second trench. Subsequently, the second conductive layer is etched to remove the second conductive layer in the second trench and to form a gate electrode in the first trench.

According to another preferred embodiment of the present invention, a semiconductor power device is also provided. The semiconductor power device includes a substrate, an epitaxial layer, a gate structure, and a termination structure. The epitaxial layer is disposed on the substrate. The epitaxial layer comprises at least a first trench and a second trench. The gate structure is disposed in the first trench, and the termination structure is disposed in the second trench. The gate structure includes a shield electrode, a gate electrode, and a gate dielectric layer. The shield electrode is disposed under the gate electrode, and the gate dielectric layer is disposed on an upper sidewall of the first trench and between the gate electrode and the epitaxial layer. The termination structure includes a termination electrode and a dielectric layer. The termination electrode and the shield electrode are connected to each other, and the dielectric layer is disposed between the termination electrode and a sidewall of the second trench. In addition, a body region is disposed in the epitaxial layer, and the second trench is only surrounded by the body region.

The manufacturing method of the present invention only needs three or four masks to form a semiconductor power device having a shield electrode. Also, the semiconductor power device can combine with a new termination structure of the present invention. Therefore, the semiconductor power device and the manufacturing method thereof of the present invention can reduce the number of the masks to simplify the processing steps, improve the yield, and decrease the manufacturing cost.

These and other objectives of the present invention will no doubt become obvious to those of ordinary skill in the art after reading the following detailed description of the preferred embodiment that is illustrated in the various figures and drawings.

DETAILED DESCRIPTION

In the following specifications and claims, certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to". For the convenience of comparison between each of the embodiments of the present invention, identical elements are denoted by identical numerals. In addition, it should be noted that the diagrams are for explanations and are not drawn as original sizes or to scale.

Figure 1:
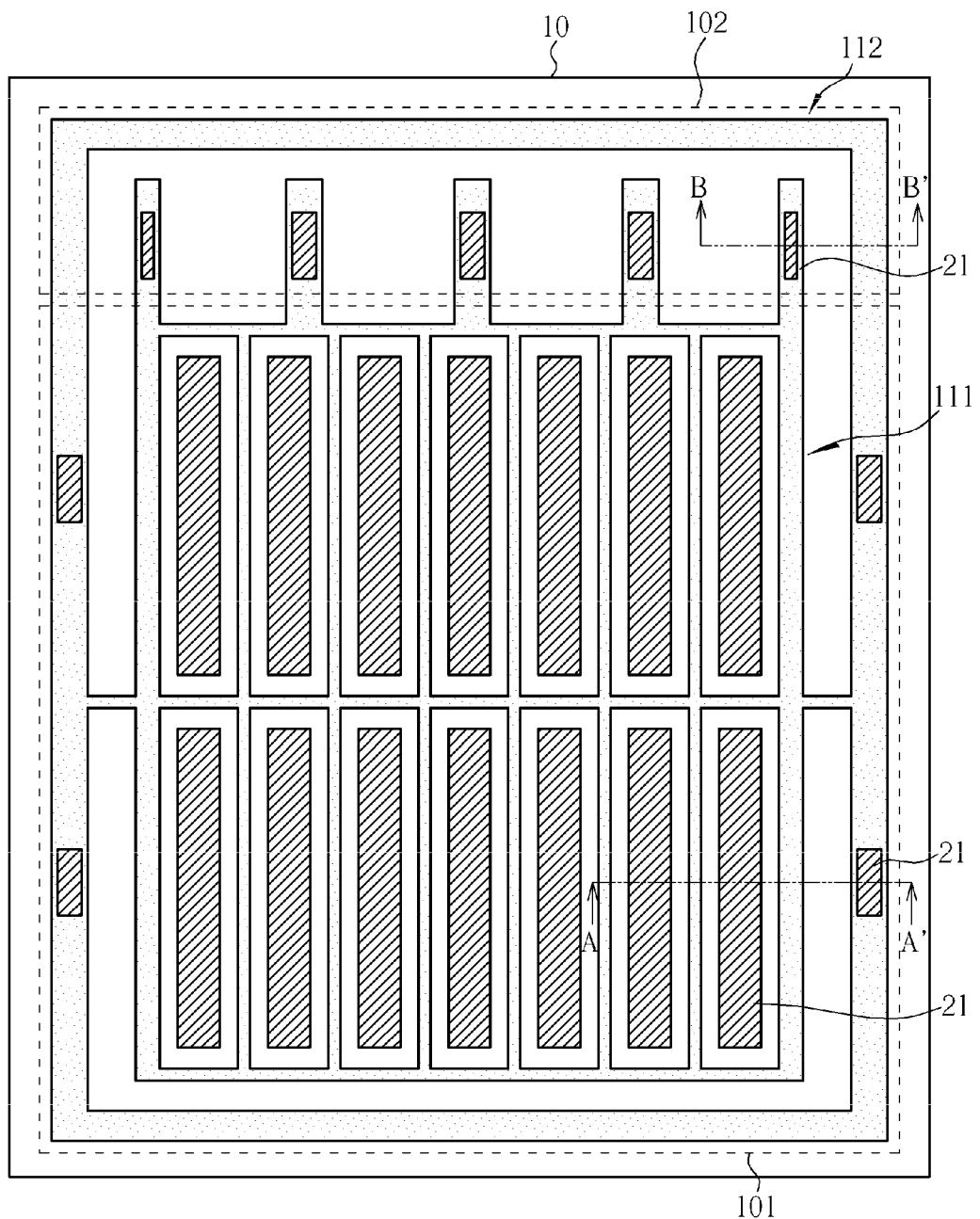
FIG. 1 is a schematic diagram illustrating a layout of a semiconductor power device according to a first preferred embodiment of the present invention.

Please refer to FIG. 1. FIG. 1 is a schematic diagram illustrating a layout of a semiconductor power device according to a first preferred embodiment of the present invention. To simplify the description, only the location of the first trench 111, the second trench 112, and the contact plug 21 are shown in FIG. 1. As shown in FIG. 1, a first region 101, a second region 102, and a plurality of the contact plugs 21 are defined on the substrate 10 for illustrating the location of a source metal layer, a gate metal layer, and the contact plugs 21 in the following description. Moreover, an outermost trench is a second trench 112, and other trenches are first trenches 111. The first trench 111 is a cell trench to accommodate a gate structure, and the second trench 112 is a termination trench to accommodate a termination structure. The first trench 111 and the second trench 112 are connected to each other. It should be noted that a width of the second trench 112 may be greater than a width of the first trench 111. As shown in FIG. 1, a ratio of the width of the second trench 112 to the width of the first trench 111 may be between three and eight in this preferred embodiment, but it is not limited herein. For example, in this preferred embodiment, the first trench 111, which is adjacent to the second trench 112, has a greater width than that of other first trenches 111.

Figure 2:
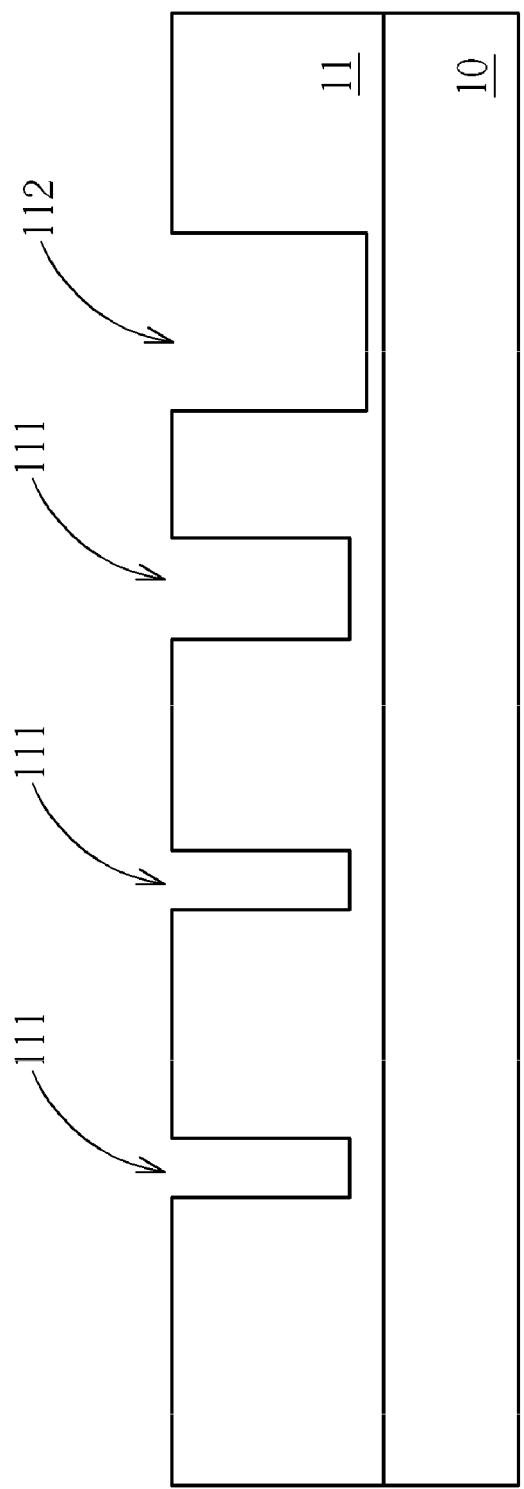
FIGS. 2-8 are schematic diagrams illustrating a manufacturing method of the semiconductor power device according to the first preferred embodiment of the present invention.

Please refer to FIG. 2-8. FIGS. 2-8 are schematic diagrams illustrating a manufacturing method of the semiconductor power device according to the first preferred embodiment of the present invention, wherein FIG. 2 is a schematic cross-sectional view along a line A-A' of FIG. 1. As shown in FIG. 2, a substrate 10 is first provided, and an epitaxial layer 11 is formed on the substrate 10. The materials of the epitaxial layer 11 and the substrate 10 may be a semiconductor, and both of the epitaxial layer 11 and the substrate 10 have a first conductive type, such as n-type or p-type. In this preferred embodiment, the first conductive type is n-type, but it is not limited herein. Furthermore, a doping concentration of the substrate 10 may be greater than that of the epitaxial layer 11. Also, the substrate 10 may serve as a drain electrode layer. Then, a lithographic process with a first mask (not shown in the figure) is performed to form a mask pattern (not shown in the figure) and then to etch a portion of the epitaxial layer 11 which is uncovered by the mask pattern. Subsequently, the mask pattern is removed, so that at least a first trench 111 and at least a second trench 112 are formed in the epitaxial layer 11. As described above, the width of the second trench 112 may be greater than that of the first trench 111. Thus, in the same etching process, because the second trench 112 with a greater width would have a higher etching rate, a depth of the second trench 112 is also greater than that of the first trench 111.

Figure 3:
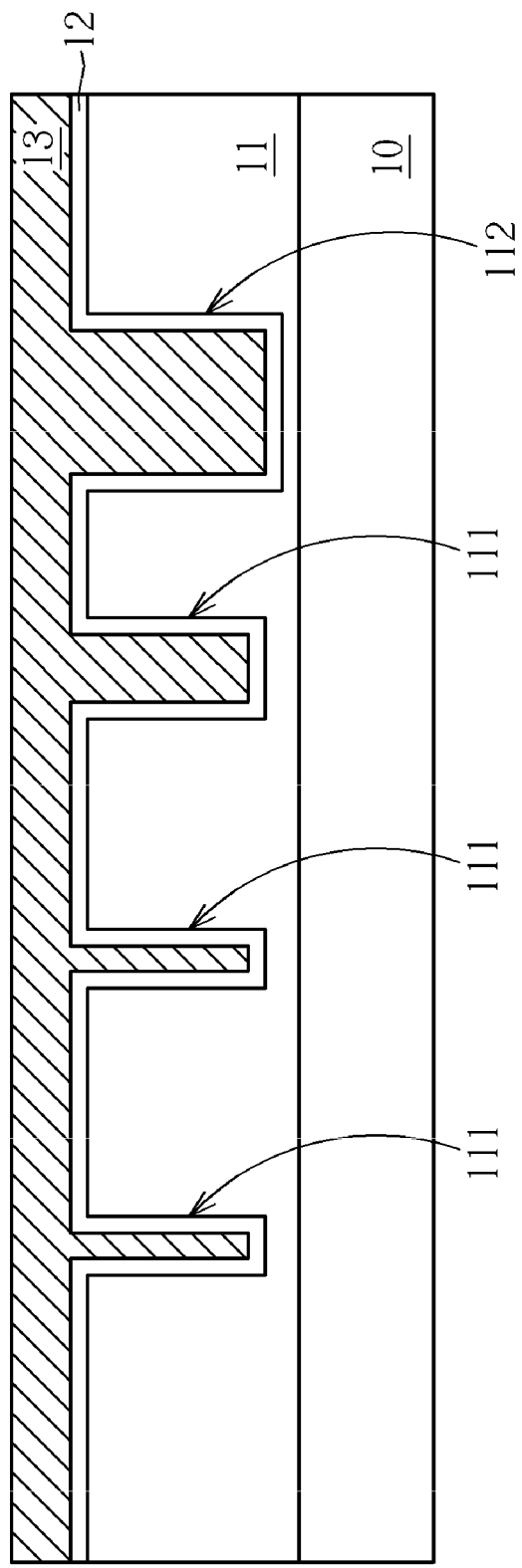

To simplify the description, FIGS. 3-6 are schematic cross-sectional views illustrating the manufacturing method of the present invention along the line A-A' of FIG. 1. As shown in FIG. 3, a first dielectric layer 12 is formed on a surface of the first trench 111 and on a surface of the second trench 112. The forming method of the first dielectric layer 12 may be a thermal oxidation process, or a chemical vapor deposition (CVD) process, or another appropriate process. Also, a thickness of the first dielectric layer 12 may be about 1000-5000 angstroms, and the first dielectric layer 12 may include silicon oxide or another suitable material. Following that, a first conductive layer 13 is deposited to fill up the first trench 111 and the second trench 112. The first conductive layer 13 may be formed by directly depositing a doped poly silicon layer or a conductor, but it is not limited herein. For example, the forming method of the first conductive layer 13 may include the following steps. First, an intrinsic polysilicon layer is deposited, and an implantation process is performed to dope the intrinsic polysilicon layer. Besides, a thermal driving process is selectively performed after the implantation process.

Figure 4:
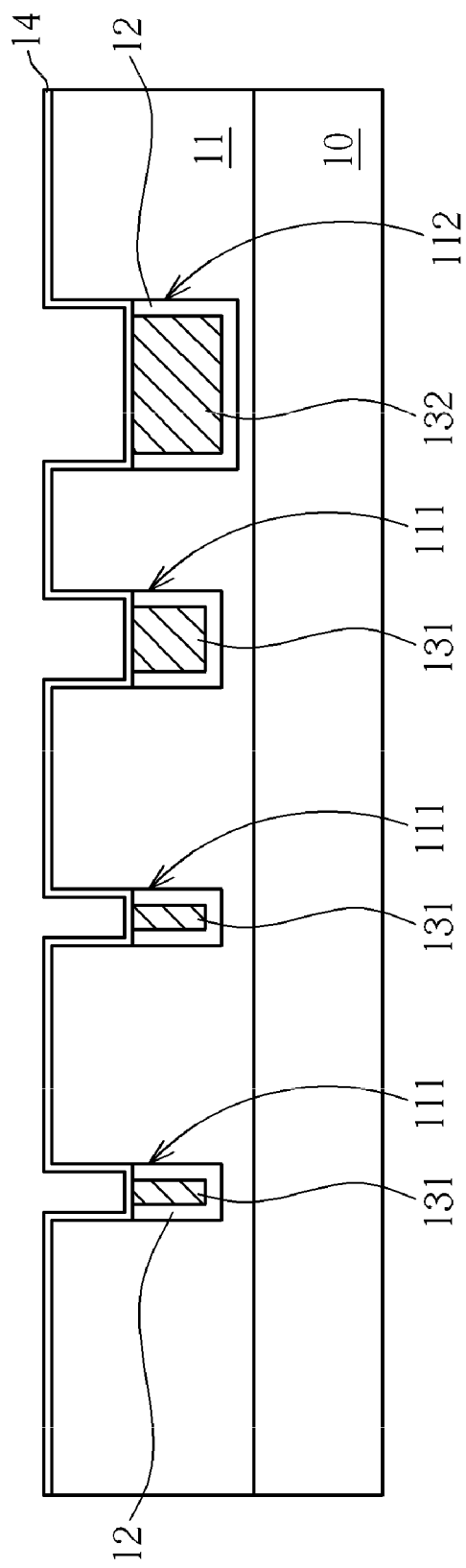

As shown in FIG. 4, a portion of the first conductive layer 13 is etched to form a shield electrode 131 in the first trench 111, to form a termination electrode 132 in the second trench 112, and to expose an upper sidewall of the first trench 111 and an upper sidewall of the second trench 112. More specifically, no additional mask is required in this step, and an etching process is completely performed on the first conductive layer 13. Accordingly, the first conductive layer 13 outside of the first trench 111 and outside of the second trench 112 is removed, and a portion of the first conductive layer 13 inside of the first trench 111 and the second trench 112 is removed. In the etching process of the first conductive layer 13, a predestined etching depth may be achieved by adjusting the etching time or other process parameters, so that an upper portion of the first trench 111 and an upper portion of the second trench 112 are exposed.

Subsequently, the first dielectric layer 12 on the upper sidewall of the first trench 111 and on the upper sidewall of the second trench 112 is removed. Then, a gate dielectric layer 14 is formed on the upper sidewall of the first trench 111 and on the upper sidewall of the second trench 112, and the gate dielectric layer 14 covers the shield electrode 131 and the termination electrode 132. The gate dielectric layer 14 may be a combination of a low temperature oxide and a high temperature oxide, or may be formed by a high-density plasma (HDP) process or a high-pressure oxidation (HIPOX) process. But it is not limited herein. In the preferred embodiment, the gate dielectric layer 14 may be completely formed, so that the gate dielectric layer 14 may further cover the epitaxial layer 11 outside of the first trench 111 and the second trench 112.

Figure 5:
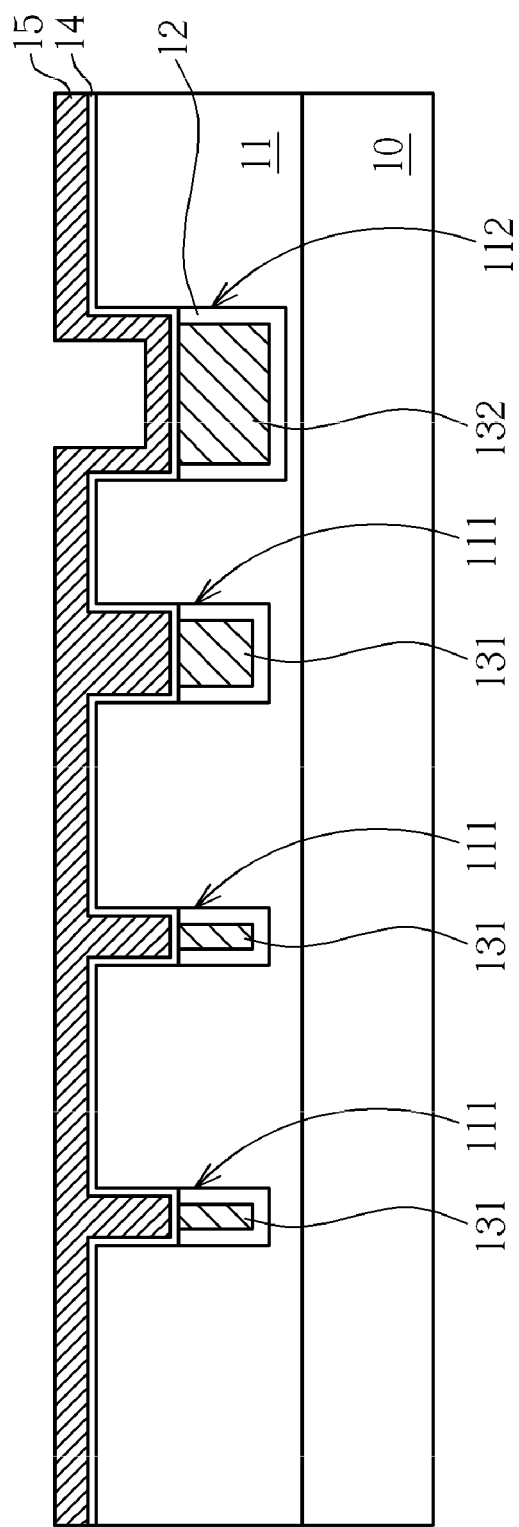

As shown in FIG. 5, a second conductive layer 15 is then deposited on the gate dielectric layer 14 to fill up the first trench 111 and partially fill in the second trench 112. More specifically, because the width of the first trench 111 is different from that of the second trench 112 in the present invention, filling up the first trench 111 and partially filling in the second trench 112 may be achieved without an additional mask.

Figure 6:
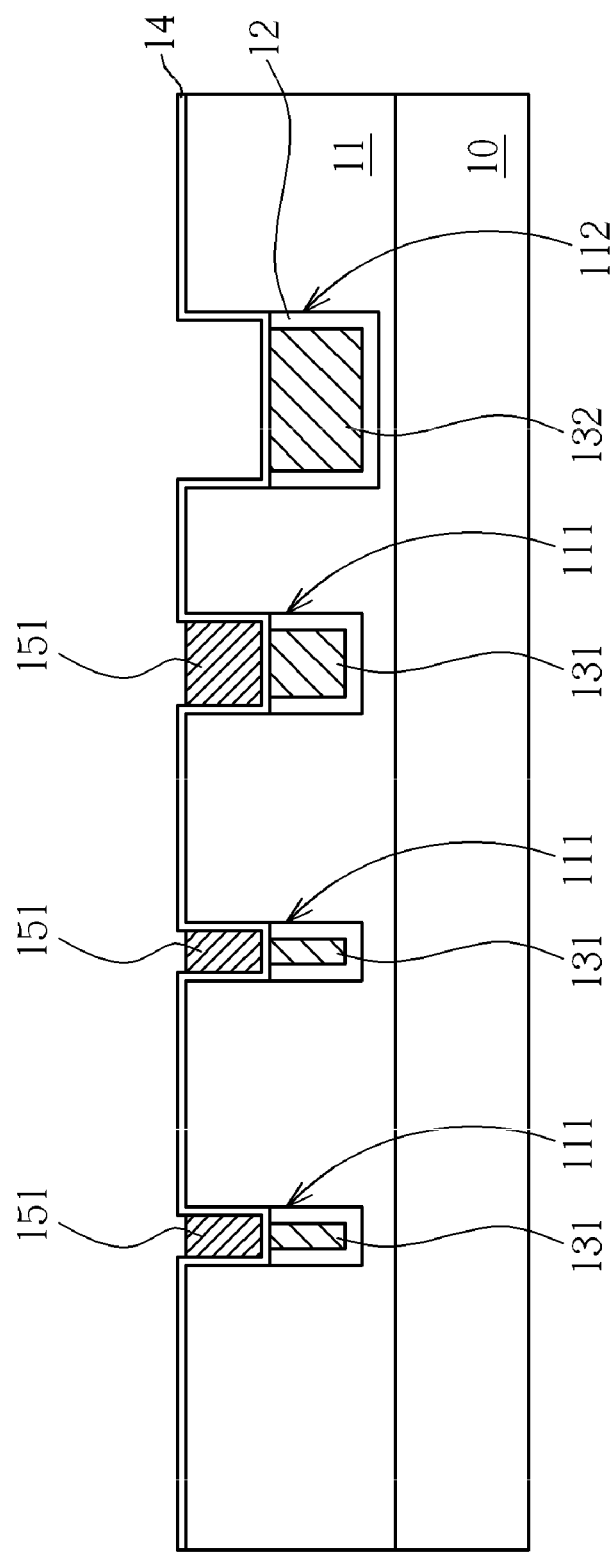

As shown in FIG. 6, the second conductive layer 15 is then etched to remove the second conductive layer 15 in the second trench 112 and to form a gate electrode 151 in each first trench 111. More specifically, an isotropic etching process may be performed on the second conductive layer completely in the present invention. Thus, removing the second conductive layer 15 in the second trench 112 and keeping the second conductive layer 15 in the first trench 111 may be achieved in the same etching process without additional masks. Besides, the second conductive layer 15 in the first trench 111 may serve as the gate electrode 151. In this preferred embodiment, the second conductive layer 15 may be a polysilicon layer. Therefore, an oxidation process may be selectively performed after etching the second conductive layer 15, so that remnants of the second conductive layer 15 in the second trench 112 could be completely oxidized.

Figure 7:
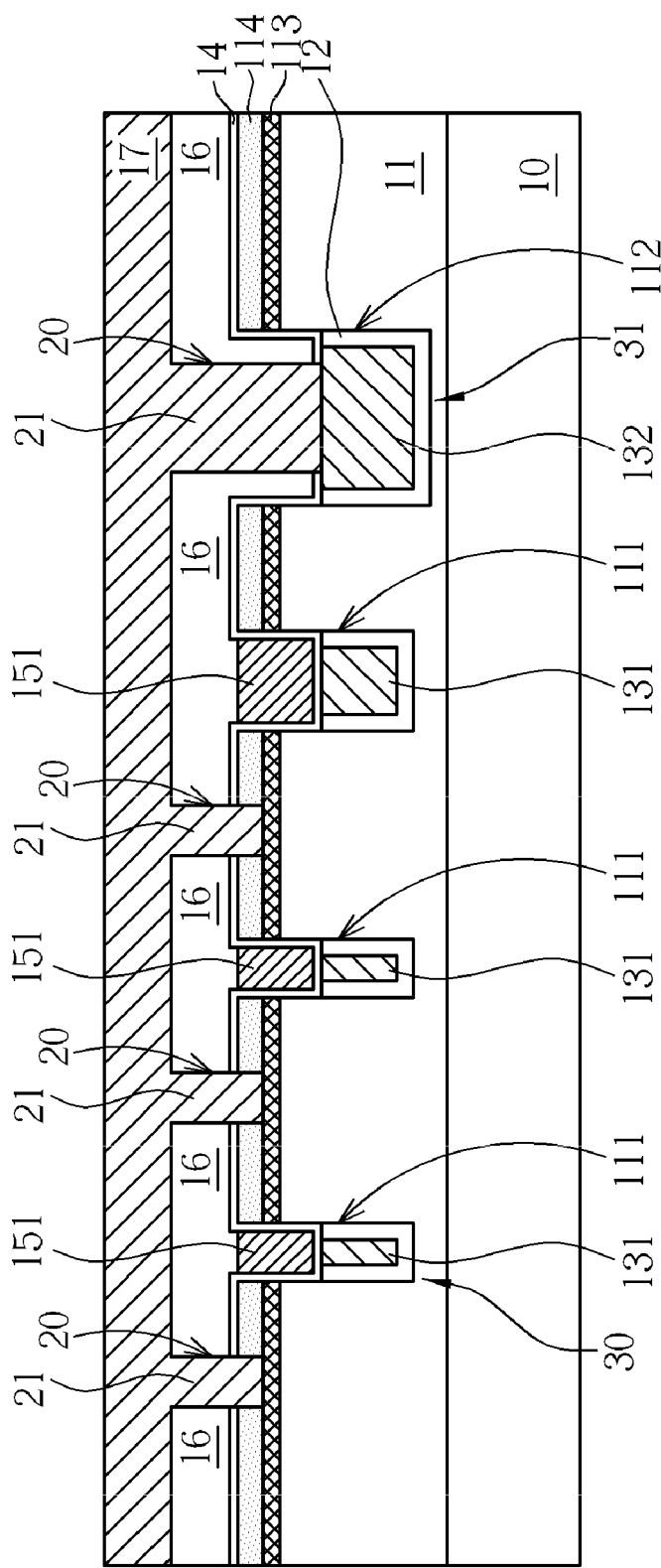
Figure 7A:
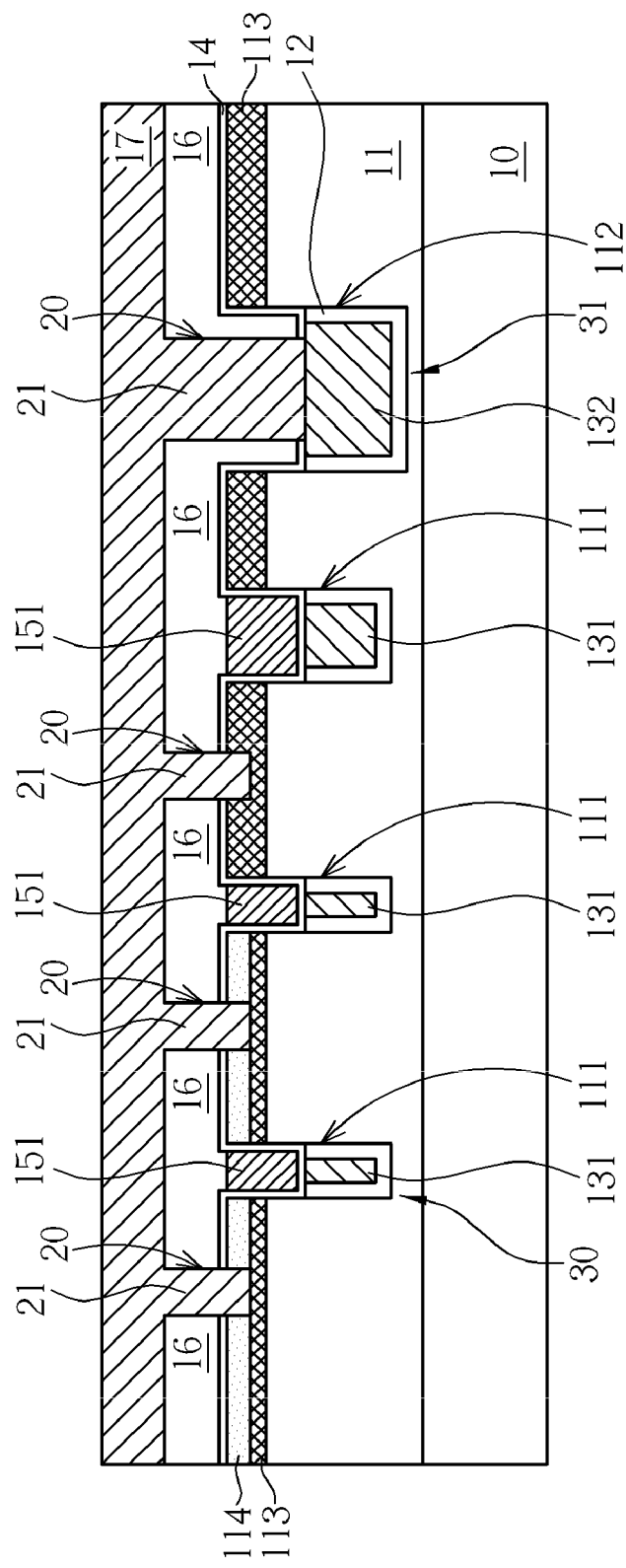
FIG. 7A is a schematic cross-sectional view illustrating another example of FIG. 7.
Figure 8:
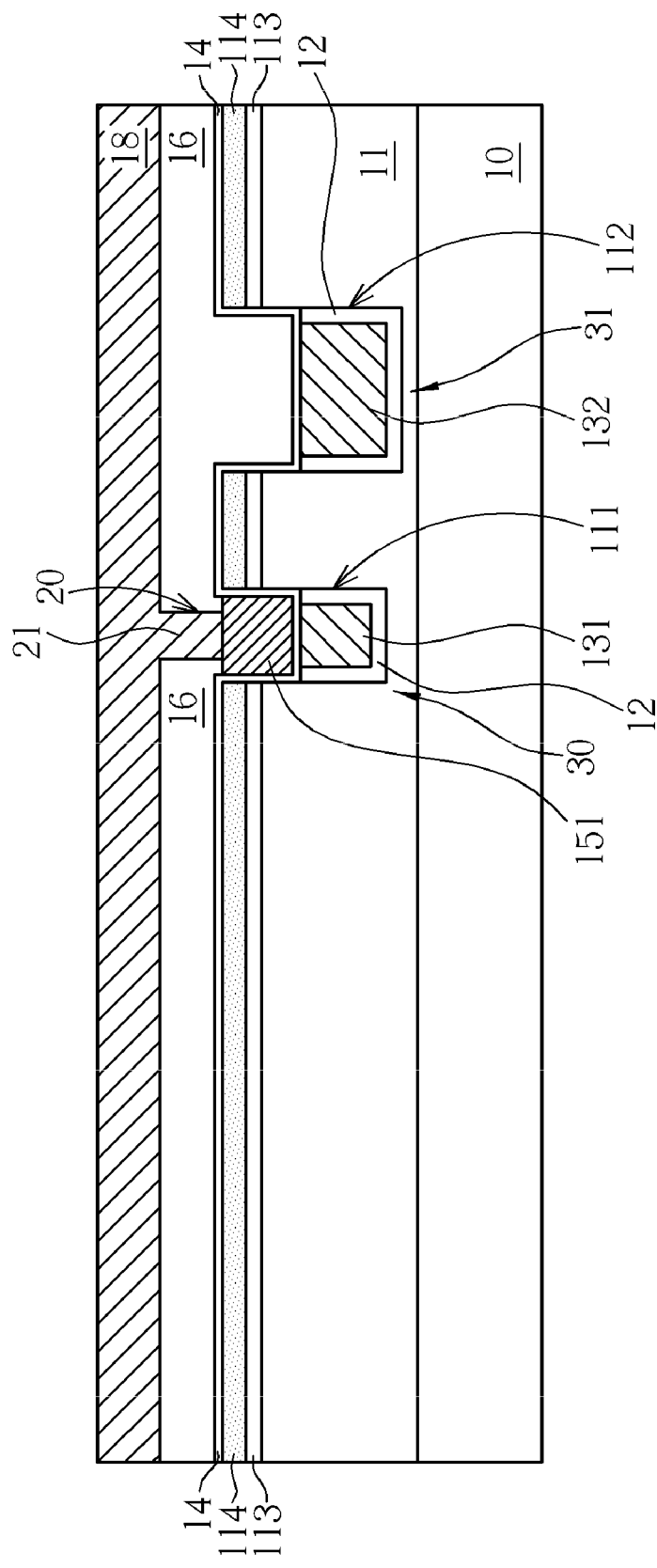

Please refer to FIG. 7 and FIG. 8. FIG. 7 is a schematic cross-sectional view illustrating the manufacturing method of the present invention along the line A-A' of FIG. 1, and FIG. 8 is a schematic cross-sectional view along the line B-B' of FIG. 1. As shown in FIG. 7 and FIG. 8, at least a body region 113 is formed in the epitaxial layer 11 and around the first trench 111. The body region 113 has a second conductive type which is different from the first conductive type. For example, in the preferred embodiment, the first conductive type of the epitaxial layer 11 and the substrate 10 is n-type, and thus the second conductive type of the body region 113 is p-type. Thereafter, at least a source region 114 is formed in the body region 113 and around the first trench 111. More specifically, the source region 114 is at one side of the body region 113 opposite to the substrate 10. The source region 114 has the first conductive type. In the preferred embodiment, the source region 114 is n-type. The forming methods of the body region 113 and the source region 114 may respectively include an implantation process, and a thermal driving process may be selectively performed after the implantation process for achieving a predestined junction depth. But it is not limited herein. In addition, the epitaxial layer 11 is completely formed in the preferred embodiment without additional masks. However, in another preferred embodiment, a lithographic process with a second mask (not shown in the figure) is performed to define the location of the source region 114. Please refer to FIG. 7A. FIG. 7A is a schematic cross-sectional view illustrating another example of FIG. 7. As shown in FIG. 7A, the source region 114 may be not formed in the body region 113 around the second trench 112. In other words, the epitaxial layer 11 around the second trench 112 only has the body region 113 without the source region 114. Furthermore, the source region 114 may be not required in the epitaxial layer 11 around the first trench 111 where is at outside of the active area. Accordingly, a better performance of unclamped inductive switching (UIS) could be achieved by the aforementioned method of defining the source region 114.

As shown in FIG. 7, FIG. 7A, and FIG. 8, an inter-layer dielectric layer 16 is completely formed on the epitaxial layer 11 to cover the source region 114, the gate dielectric layer 14, and the gate electrode 151. The inter-layer dielectric layer 16 may be formed by a high-density plasma process or a chemical vapor deposition (CVD) process, and a material of the inter-layer dielectric layer 16 may be oxide, boron phosphorus silicon glass (BPSG), a combination of oxide and boron phosphorus silicon glass, or other suitable material. Moreover, the inter-layer dielectric layer 16 may be heated to flow, so that a smooth surface may be formed. Subsequently, a lithographic process with a third mask (not shown in the figure) is performed to form a plurality of contact holes 20 in the inter-layer dielectric layer 16 and in the gate dielectric layer 14 for respectively exposing the source region 114, the termination electrode 132, and the gate electrode 151 on different locations. Following that, a metal layer (not shown in the figure) is formed, and a lithographic process with a fourth mask (not shown in the figure) is performed to form a patterned metal layer on the inter-layer dielectric layer 16. A material of the patterned metal layer may include Titanium (Ti), titanium nitride (TiN), tungsten (W), aluminum silicon alloy (Al—Si), or aluminum silicon copper alloy (Al—Si—Cu), but it is not limited herein. The patterned metal layer includes a source metal layer 17 (shown in FIG. 7 and FIG. 7A) and a gate metal layer 18 (shown in FIG. 8). The location arrangement of the source metal layer 17 and the gate metal layer 18 is shown in FIG. 1. The source metal layer 17 is disposed on the first region 101 of the substrate 10, and the gate metal layer 18 is disposed on the second region 102 of the substrate 10. Accordingly, as shown in FIG. 7 and FIG. 7A, the source metal layer 17 is filled in the contact hole 20 of exposing the source region 114 and in the contact hole 20 of exposing the termination electrode 132, and the source metal layer 17 is electrically connected to the source region 114 and the termination electrode 132. In the same way, as shown in FIG. 8, the gate metal layer 18 is filled in the contact hole 20 of exposing the gate electrode 151, and the gate metal layer 18 is electrically connected to the gate electrode 151.

Accordingly, the semiconductor power device of the first preferred embodiment has been finished. As shown in FIG. 7, FIG. 7A, and FIG. 8, the semiconductor power device includes the substrate 10 having the epitaxial layer 11, the gate structure 30, and the termination structure 31. The gate structure 30 includes the shield electrode 131, the gate electrode 151, and the gate dielectric layer 14. The shield electrode 131 is disposed under the gate electrode 151. The gate dielectric layer 14 is disposed on the upper sidewall of the first trench 111, disposed between the gate electrode 151 and the epitaxial layer 11, disposed between the gate electrode 151 and the shield electrode 131. The termination structure 31 includes the termination electrode 132 and a dielectric layer disposed between the termination electrode 132 and the sidewall of the second trench 112. In the preferred embodiment, the aforementioned dielectric layer may include the first dielectric layer 12 disposed in the second trench 112, the gate dielectric layer 14, and the inter-layer dielectric layer 16. In addition, the shield electrode 131 and the termination electrode 132 are electrically connected to each other, so that the source metal layer 17 may provide an external source voltage to both of the shield electrode 131 and the termination electrode 132 through the contact hole 20 of exposing the shield electrode 131. Accordingly, the shield electrode 131 of the present invention is capable of reducing the capacitance between the gate electrode 151 and the substrate 10 which serves as a drain electrode layer, and the breakdown voltage of the semiconductor power device may be effectively improved. On the other hand, a controlling voltage of the gate electrode 151 is provided by the gate metal layer 18.

Figure 9:
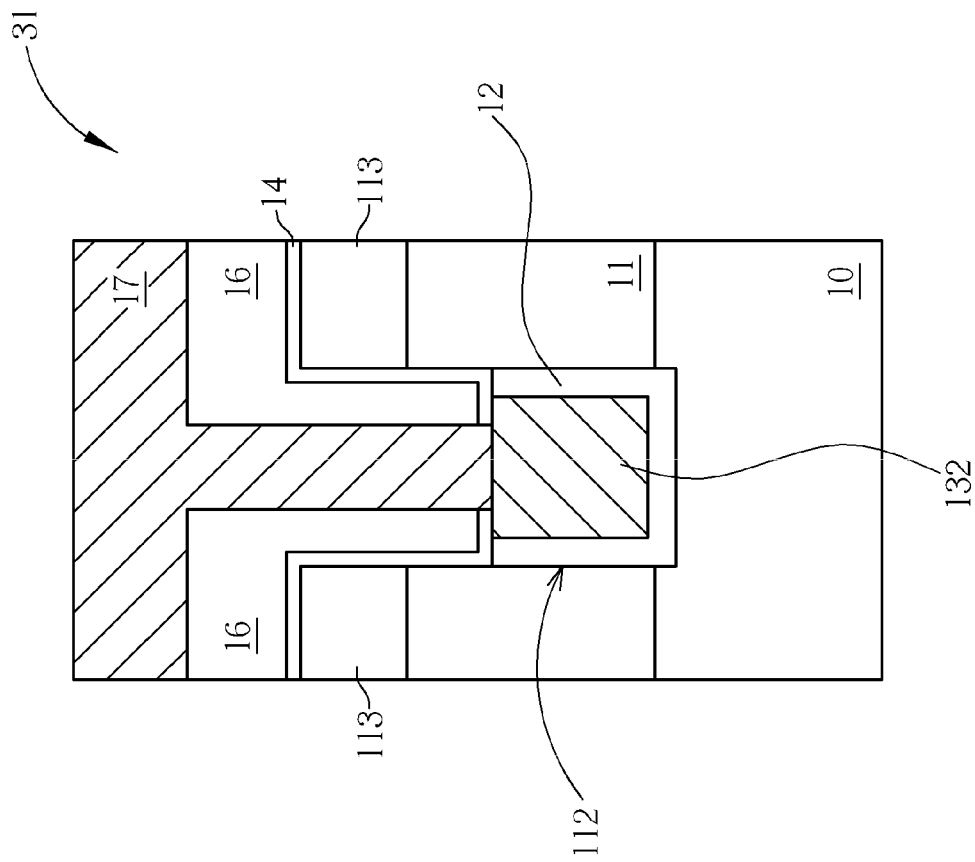
FIG. 9 is a schematic cross-sectional view illustrating a termination structure of a semiconductor power device according to a second preferred embodiment of the present invention.
Figure 9A:
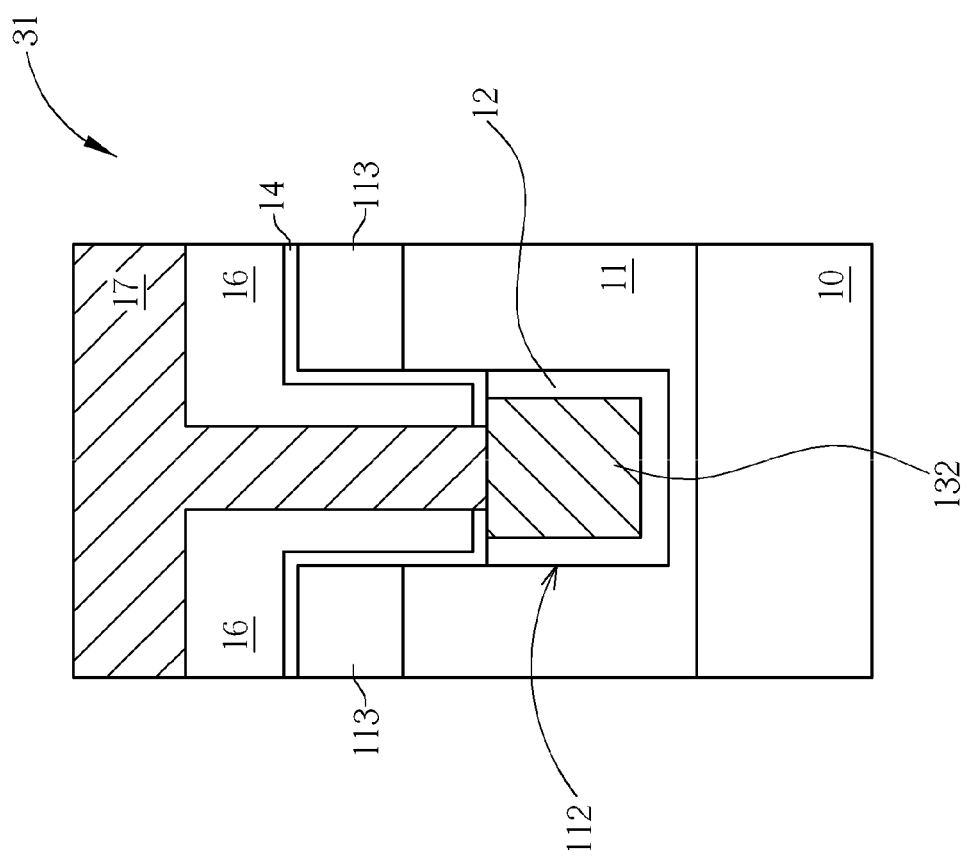
FIG. 9A is a schematic cross-sectional view illustrating another example of FIG. 9.

The termination structure of the semiconductor power device of the present invention is not limited to that in the first preferred embodiment, and the termination structure may have other designs. In the following description, a second preferred embodiment and a third preferred embodiment are utilized to illustrate other designs of the termination structure. For the convenience of comparison between the following preferred embodiments and the first preferred embodiment, only the differences are illustrated, and repeated descriptions are not redundantly given. Please refer to FIG. 9. FIG. 9 is a schematic cross-sectional view illustrating a termination structure 31 of a semiconductor power device according to a second preferred embodiment of the present invention, wherein the termination structure 31 is a schematic cross-sectional view along the line A-A' of FIG. 1. As shown in FIG. 9, the second trench 112, which is configured to accommodate the termination structure 31, could be extended into the substrate 10, but not necessarily. More specifically, in the process of forming the second trench 112 on the substrate 10 which has the epitaxial layer 11, the second trench 112 may be etched to pass through the epitaxial layer 11 and may be extended into the substrate 10 by adjusting the processing parameters. For example, an etching depth of the second trench 112 may be increased by enhancing the etching time, increasing the etching concentration, or enlarging the width of the second trench 112. As a result, in the second preferred embodiment, the termination structure 31 of the semiconductor power device is capable of providing a better voltage-withstand ability to effectively avoid the interaction between the semiconductor power device and other components. In addition, as shown in FIG. 9, the second trench 112 is only surrounded by the body region 113 without an additional source region, so that a better performance of unclamped inductive switching could be achieved. In addition, it should be noted that the second trench 112 may be not extended into the substrate 10. Please refer to FIG. 9. FIG. 9A is a schematic cross-sectional view illustrating another example of FIG. 9. As shown in FIG. 9A, the second trench 112 does not extended into the substrate 10.

Figure 10:
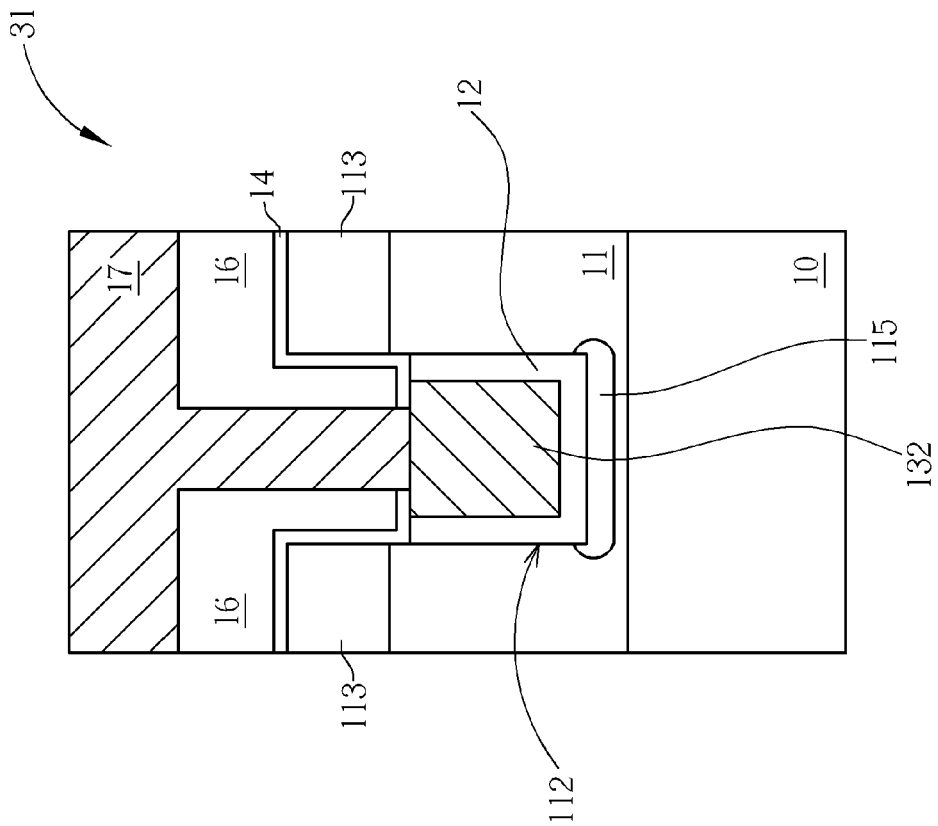
FIG. 10 is a schematic cross-sectional view illustrating a termination structure of a semiconductor power device according to a third preferred embodiment of the present invention.

Please refer to FIG. 10. FIG. 10 is a schematic cross-sectional view illustrating a termination structure 31 of a semiconductor power device according to a third preferred embodiment of the present invention, wherein the termination structure 31 is a schematic cross-sectional view along the line A-A' of FIG. 1. As shown in FIG. 10, before the first dielectric layer 12 is formed, the manufacturing method further includes forming a doped region 115 under the second trench 112, and the doped region 115 is connected to the second trench 112. More specifically, the forming method of the doped region 115 may be an implantation process, and the doped region 115 has the first conductive type. In other words, the conductive type of the doped region 115 and the conductive type of the epitaxial layer 11 are the same. For instance, the first conductive type of the epitaxial layer 11 and the substrate 10 is n-type in this preferred embodiment, and the doped region 115 is also n-type. Moreover, the doped region 115 may be a heavily doped region. Accordingly, the present invention can prevent the parasitic transistor turn on to induce the leakage. It should be noted that the termination structure 31 of the present invention is not limited to the aforementioned three preferred embodiments. For example, the termination structure may have both of the technique features of the second preferred embodiment and the third preferred embodiment.

In summary, the manufacturing method of the present invention only needs three or four masks to form the semiconductor power device which is usually formed with up to eight or nine masks. Thus, the present invention is capable of simplifying processes, improving yield, and reducing production cost. In addition, the shield electrode is disposed under the gate electrode, so that the capacitance between the gate electrode and the drain electrode layer can be reduced and the breakdown voltage of the semiconductor power device can be effectively improved. Moreover, the termination structure, which is constituted by the termination electrode and the dielectric layer disposed between the termination electrode and the sidewall of the second trench, is capable of preventing the interaction between the semiconductor power device and other components. Furthermore, the second trench, which is configured to accommodate the termination structure, may extend into the substrate, so that a better volt-age-withstand ability could be provided. Also, a doped region may be formed under the second trench to control the voltage-withstand ability by adjusting the concentration of the doped region, and thus the blocking effect of the termination structure could be improved.

Those skilled in the art will readily observe that numerous modifications and alterations of the device and method may be made while retaining the teachings of the invention.

What is claimed is:

1. A semiconductor power device, comprising:
   a substrate;
   an epitaxial layer, disposed on the substrate, wherein the epitaxial layer comprises at least a first trench and a second trench;
   a gate structure disposed in the first trench, the gate structure comprising:
      a shield electrode and a gate electrode, the shield electrode being disposed under the gate electrode; and
      a gate dielectric layer, disposed on an upper sidewall of the first trench and between the gate electrode and the epitaxial layer;
   a termination structure disposed in the second trench, the termination structure comprising:
      a termination electrode, wherein the termination electrode and the shield electrode are connected to each other; and
      a dielectric layer disposed between the termination electrode and a sidewall of the second trench; and
   a body region disposed in the epitaxial layer, wherein the second trench is only surrounded by the body region.

2. The semiconductor power device of claim 1, wherein the second trench extends into the substrate.

3. The semiconductor power device of claim 1, further comprising a doped region disposed under the second trench.

4. The semiconductor power device of claim 3, wherein a conductive type of the doped region and a conductive type of the epitaxial layer are the same.

5. The semiconductor power device of claim 1, wherein the epitaxial layer comprises the body region and a source region around the first trench, and the semiconductor power device further comprises an inter-layer dielectric layer to cover the source region, the gate electrode, and the gate dielectric layer.

6. The semiconductor power device of claim 5, wherein the Inter-layer dielectric layer and the gate dielectric layer comprise a plurality of contact holes to respectively expose the source region, the termination electrode, and the gate electrode.

7. The semiconductor power device of claim 6, further comprising a source metal layer disposed on the inter-layer dielectric layer, wherein the source metal layer is electrically connected to the source region through the contact hole of exposing the source region, and the source metal layer is electrically connected to the termination electrode through the contact hole of exposing the termination electrode.

8. The semiconductor power device of claim 6, further comprising a gate metal layer disposed on the inter-layer dielectric layer, wherein the gate metal layer is electrically connected to the gate electrode through the contact hole of exposing the gate electrode.

* * * * *